(12) United States Patent
Susaki et al.

(10) Patent No.: US 9,605,357 B2
(45) Date of Patent: Mar. 28, 2017

(54) METHOD FOR FORMING MAGNESIUM OXIDE THIN FILM AND PROCESSED PLATE

(75) Inventors: Tomofumi Susaki, Yokohama (JP); Hideo Hosono, Yokohama (JP); Tadahiro Fujihashi, Yokohama (JP); Yoshitake Toda, Yokohama (JP)

(73) Assignee: JAPAN SCIENCE AND TECHNOLOGY AGENCY, Saitama (JP)

(*) Notice: Subject to any disclaimer, the term of this patent is extended or adjusted under 35 U.S.C. 154(b) by 408 days.

(21) Appl. No.: 14/343,719

(22) PCT Filed: Mar. 9, 2012

(86) PCT No.: PCT/JP2012/056191
§ 371 (c)(1),
(2), (4) Date: Apr. 29, 2014

(87) PCT Pub. No.: WO2013/035360
PCT Pub. Date: Mar. 14, 2013

(65) Prior Publication Data
US 2014/0230724 A1    Aug. 21, 2014

(30) Foreign Application Priority Data
Sep. 9, 2011   (JP) .................. 2011-197562

(51) Int. Cl.
| | |
|---|---|
| C30B 23/02 | (2006.01) |
| C30B 23/06 | (2006.01) |
| B01D 53/02 | (2006.01) |
| C30B 29/16 | (2006.01) |

(Continued)

(52) U.S. Cl.
CPC ............ *C30B 23/066* (2013.01); *B01D 53/02* (2013.01); *B01J 20/041* (2013.01); *B01J 20/3204* (2013.01); *B01J 20/3236* (2013.01); *C30B 23/025* (2013.01); *C30B 29/16* (2013.01); *B01D 2253/1124* (2013.01); *B01D 2253/25* (2013.01); *B01D 2257/504* (2013.01); *Y02C 10/08* (2013.01)

(58) Field of Classification Search
CPC .................. C30B 23/02; C30B 23/08
See application file for complete search history.

(56) References Cited

PUBLICATIONS

Sho Kumada et al., "Tuning of Surface Roughness and Lattice Constant in MgO(111)/Al$_2$O$_3$(0001) Grown by Laser Energy Controlled Pulsed Laser Deposition," Japanese Journal of Applied Physics, vol. 50, No. 8, p. 085503, The Japan Society of Applied Physics, XP055198178, Aug. 22, 2011.

(Continued)

*Primary Examiner* — Robert M Kunemund
(74) *Attorney, Agent, or Firm* — Michael Best & Friedrich LLP (57) ABSTRACT

A method for depositing a magnesium oxide thin film on a substrate by a laser abrasion method using a sintered body or single crystal of magnesium oxide as a target. In this method, a flat processed film made of magnesium oxide having a (111) plane as its front surface is prepared, using a substrate made of strontium titanate having a (111) plane as its principal surface or yttria-stabilized zirconia having a (111) plane as its principal surface, by directly depositing a film on the principal surface of the substrate and epitaxially growing the film.

8 Claims, 6 Drawing Sheets

(51) Int. Cl.
 B01J 20/04 (2006.01)
 B01J 20/32 (2006.01)

(56) References Cited

PUBLICATIONS

Kosuke Matsuzaki et al., "Structural study of polar MgO(111) epitaxial thin films grown on SrTiO$_3$(111)," Physical Review B, vol. 84, No. 23, American Physical Society, XP0055198163. Dec. 1, 2011.
Extended search report issued in European Application No. 12829861.9, dated Jul. 1, 2015.
X.W.Li, A. Gupta, Gang Xiao, W. Qian, and V.P.Dravid, "Fabrication and properties of heteroepitaxial magnetite (Fe$_3$O$_4$) tunnel junctions", Applied Physics Letters vol. 73 No. 22, Nov. 30, 1998, pp. 3282-3284 (3 sheets), American Institute of Physics.
D. Yoon, S. A. Oliver, and C. Vittoria, "Enhanced coercive and remanence fields for CoFe$_2$O$_4$ and BaFe$_{12}$O$_{19}$ bilayers deposited on (111) MgO", Journal of Applied Physics vol. 91 No. 10, May 15, 2002, pp. 7379-7381 (3 sheets), American Institute of Physics.
M. Noda, T. Yamada, K. Seki, T. Kamo, K. Yamashita, H. Funakubo, and M. Okuyama, "Comparison of BST Film Microwave Tunable Devices Based on (100) and (111) MgO Sustrates", IEEE Transaction on UFFC, vol. 57 No. 10, Oct. 2010, pp. 2221-2227 (7 sheets), IEEE.
International Search Report issued in Application No. PCT/JP2012/056191, mailed May 29, 2012.
Fujihashi, Y. Toda, H. Hosono, and T. Susaki, "MgO/Nb:SrTiO$_3$(111) surface properties studied by CO$_2$ adsorption", Extended Abstracts, Japan Society of Applied Physics and Related Societies, vol. 58, Mar. 24, 2011, P24p-BC-2 (2 sheets).
T. Susaki, "New Functionalities in Artificial Stacked Structures of Wide-gap Oxides", Annual Report of the Murata Science Foundation, No. 23, 2009, pp. 304-306 (3 sheets).
T. Susaki, A. Makishima, and H. Hosono, "Tunable work function in MgO/Nb:SrTiO$_3$ surface studied by Kelvin probe technique", Physical Review B. vol. 83, Mar. 16, 2011, pp. 115435-1-115435-5 (5 sheets), American Physical Society.
K. Matsuzaki, H. Hosono, and T. Susaki, "Layer-by-layer epitaxial growth of polar MgO(111) thin films", Physical Review B. vol. 82, Jul. 16, 2010, pp. 033408-1-033408-4 (4 sheets), The American Physical Society.
Suzaki, "Potential of non-transition metal compounds: MgO(111) thin film formation and evaluation," Materials and Structures Laboratory of Tokyo Institute of Technology, and Presto of Japan Science and Technology Agency (JST), Thirty-five Meeting of Compound/New Magnetic Material Study Group, Jan. 28, 2010.
Office Action issued in Korean Application No. 10-2014-7006777, dated Jan. 6, 2017.

METHOD FOR FORMING MAGNESIUM OXIDE THIN FILM AND PROCESSED PLATE

TECHNICAL FIELD

Various aspects and embodiments of the present invention relate to a preparation method for a magnesium oxide thin film and a processed plate.

BACKGROUND ART

Similar to sapphire ($Al_2O_3$), magnesium oxide (MgO) is a typical oxide insulator having a wide gap. Therefore, MgO is sometimes used as a substrate to grow a thin film. When MgO is used as a growth substrate, matching of a lattice constant of the MgO substrate with respect to a lattice constant of a growing thin film is considered. As a crystal face of MgO on which a thin film is grown, for example, a plane whose plane orientation is (100) is used in some cases (refer to, for example, Non-Patent Document 1). Non-Patent Document 1 describes $Fe_3O_4(100)/MgO(100)/Fe_3O_4(100)$ as a configuration that provides a TMR effect. MgO and $Fe_3O_4$ have a lattice mismatch of 1% or less therebetween, which suggests that MgO is suitable as a growth substrate for $Fe_3O_4$.

On the other hand, as a crystal face of MgO on which a thin film is grown, for example, a plane whose plane orientation is (111) is used in some cases (refer to, for example, Non-Patent Documents 2 and 3). Non-Patent Documents 2 describes that the coercivity and residual magnetism are increased by forming a ferromagnet having a spinel structure on a MgO(111) plane. Non-Patent Document 3 describes forming a $(Ba,Sr)TiO_3$ thin film, which is a typical ferroelectric thin film, on a (111) plane or on a (100) plane of a MgO substrate. Non-Patent Document 3 further describes that forming a $(Ba,Sr)TiO_3$ thin film on the (111) plane of a MgO substrate results in satisfactory characteristics in a high-frequency range as compared with when forming the same on the (100) plane.

As described above, the (100) plane and (111) plane of MgO can be applied to a variety of films as growth substrates. Also, the (111) plane of MgO provides advantageous effects as compared with those of the (100) plane in some cases. In addition, Non-Patent Document 4 describes that a (111) plane of MgO that results in a root mean square roughness $R_{RMS}$ of 0.21 to 0.23 nm can be obtained by forming NiO(111) on yttria-stabilized zirconia (YSZ) having a (111) plane as its principal surface and growing MgO on said NiO(111). Here, the root mean square roughness $R_{RMS}$ is also represented by $R_q$ (quadratic mean roughness) (JIS B0601).

CITATION LIST

Non Patent Literature

Non-Patent Document 1: X. W. Li, A. Gupta, Gang Xiao, W. Qian, and V. P. Dravid, Appl. Phys. Lett. 73, 3282 (1998).

Non-Patent Document 2: S. D. Yoon, S. A. Oliver, and C. Vittoria, J. Appl. Phys. 91, 7379 (2002).

Non-Patent Document 3: M. Noda, T. Yamada, K. Seki, T. Kamo, K. Yamashita, H. Funakubo and M. Okuyama: IEEE Trans. on UFFC, 57(10) (2010) 2221-2227.

Non-Patent Document 4: K. Matsuzaki, H. Hosono, T. Susaki. Layer-by-layer epitaxial growth of polar MgO (111) thin films, PHYSICAL REVIEW B, vol. 82, 3, p. 033408, July 2010.

SUMMARY OF INVENTION

Technical Problem

A (100) plane of MgO has $Mg^{2+}$ as cations and $O^{2-}$ as anions exposed in equal amounts, and is electrostatically stable. On the other hand, a (111) plane of MgO, on which either of $Mg^{2+}$ as cations and $O^{2-}$ as anions are exposed, is thus electrostatically unstable, and does not naturally occur. That is, a (111) plane of MgO is to have unique chemical and electrical surface characteristics. The characteristics are considered to be more remarkable as the (111) plane of MgO is more flat. Accordingly, if a flat (111) plane of MgO can be obtained, there is a possibility of enabling preparation of a new device as a substrate that can add value other than control of a growth surface by lattice matching.

Here, a (111) plane of MgO is ordinarily obtained by a method of cutting a MgO(111) plane out of a single crystal, and mechanically polishing the same. However, with such a technique, the root mean square roughness $R_q$ results in an order of three nanometers or more, and it is difficult to obtain an electrostatically unstable flat plane of MgO(111). Thus, while on the other hand MgO(111) has unique characteristics as mentioned above, it is difficult to adopt MgO(111) as a substrate that controls a growing film on the order of nanometers. Moreover, with the technique described in Non-Patent Document 4, it is necessary to form a NiO film between the thin film and substrate, which is thus not only troublesome and inefficient but also results in a film that is thicker for the NiO film. In the technical field concerned, there has been a demand for a preparation method that can prepare a flat MgO(111) plane by a simple technique and a processed plate having a flat MgO(111) plane.

Solution to Problem

A preparation method for a magnesium oxide thin film according to an aspect of the present invention is a method for depositing a magnesium oxide thin film on a substrate by a laser abrasion method using a sintered body or single crystal of magnesium oxide as a target. In this method, a processed film made of magnesium oxide is prepared on a substrate. The substrate is made of strontium titanate having a (111) plane as its principal surface or yttria-stabilized zirconia having a (111) plane as its principal surface. By directly depositing a film on the principal surface of said substrate and epitaxially growing the film, a flat processed film made of magnesium oxide having a (111) plane as its front surface is prepared.

In this preparation method, magnesium oxide having a (111) plane as its front surface is directly formed on the (111) plane of the substrate made of strontium titanate (111) or yttria-stabilized zirconia (111). That is, by adopting the (111) plane of the substrate made of strontium titanate (111) or yttria-stabilized zirconia (111) as a growth substrate for MgO and depositing MgO by a laser abrasion method and epitaxially growing the MgO, a flat MgO(111) plane can be obtained.

Here, the flat processed film may be a film having a root mean square roughness $R_q$ of a magnesium oxide (111) plane not exceeding 1 nm. Moreover, the flat processed film may be a film having a root mean square roughness $R_q$ of a magnesium oxide (111) plane not exceeding 0.5 nm.

In an embodiment, the amount of laser energy in the laser abrasion method may be 100 mJ or more. Setting energy during film formation great as compared with that in the conventional technique allows formation of a MgO(111) plane.

In an embodiment, the processed film may be a film having a film thickness not exceeding 50 nm.

Moreover, a processed plate according to another aspect of the present invention includes a substrate and a processed film. The substrate is made of strontium titanate having a (111) plane as its principal surface or yttria-stabilized zirconia having a (111) plane as its principal surface. The processed film is directly formed on the principal surface of the substrate, is flat, and is made of magnesium oxide having a (111) plane as its front surface.

In this processed plate, magnesium oxide having a (111) plane as its front surface is directly formed on the (111) plane of the substrate made of strontium titanate (111) or yttria-stabilized zirconia (111). That is, by adopting the (111) plane of strontium titanate (111) or yttria-stabilized zirconia (111) as a growth substrate for MgO, a flat MgO(111) plane can be obtained.

In an embodiment, the processed film may be a film having a root mean square roughness $R_q$ of a (111) plane of magnesium oxide not exceeding 1 nm. In an embodiment, the processed film may be a film having a root mean square roughness $R_q$ of a magnesium oxide (111) plane not exceeding 0.5 nm. Further, in an embodiment, the processed film may be a film having a film thickness not exceeding 50 nm.

Moreover, a device according to another aspect of the present invention is a device using as an adsorption surface the processed film of the processed plate described above. Using the above-described processed plate allows arranging a device that adsorbs predetermined molecules or a device that detects predetermined molecules.

Advantageous Effects of Invention

As described above, according to the various aspects and embodiments of the present invention, a flat MgO(111) plane can be obtained by a simple technique.

BRIEF DESCRIPTION OF DRAWINGS

FIG. 5 shows AFM images of processed films according to examples.

DESCRIPTION OF EMBODIMENTS

Hereinafter, various embodiments will be described in detail with reference to the accompanying drawings. Here, in the description of the drawings, the same elements are denoted by the same reference numerals, and overlapping description will be omitted. Also, dimensional ratios of the drawings are not always coincident with those in the description.

Figure 1:
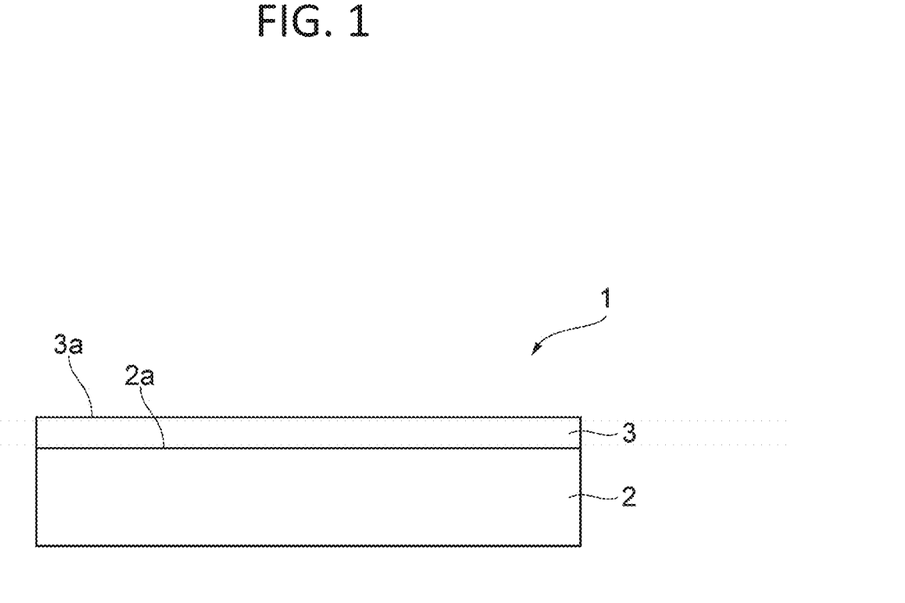
FIG. 1 is a view for explaining a configuration of a processed plate.

Description will be given of a configuration of a processed plate according to the present embodiment. FIG. 1 is a view for explaining the configuration of the processed plate 1. The processed plate 1 includes a substrate 2 and a processed film 3.

The substrate 2 is a plate-like object formed by an inorganic material, and is preferably a crystalline or amorphous structure formed of one or more of strontium titanate, yttria-stabilized zirconia, and the like. A preferred crystal structure of the substrate 2 has three-fold symmetry or six-fold symmetry with respect to a direction along a normal to a principal surface 2a. As the substrate 2, for example, strontium titanate ($SrTiO_3$) having a (111) plane as its front surface, yttria-stabilized zirconia (YSZ) having a (111) plane as its front surface, or the like can be used.

$SrTiO_3$, which is also called strontium titanium (IV) trioxide, is a complex oxide and has a perovskite type crystal structure. Further, the $SrTiO_3$ or the like that constitutes the substrate 2 may be doped with an impurity. If a voltage is applied to the substrate 2 doped with an impurity, a current flows in the substrate 2, so that the substrate 2 is heated by resistance heat generation. Accordingly, it becomes possible to control the temperature of the processed film 3 by controlling a voltage to be applied to the substrate 2. That is, heating of the processed film 3 can be easily performed. As the impurity, for example, niobium (Nb) is used. The doping amount of Nb as an impurity is, for example, 0.01 to 0.5 percent by weight. Moreover, the substrate 2 has, for example, a principal surface 2a which is oriented in (111) as plane orientation.

The processed film is directly formed on the principal surface 2a of the substrate 2. That is, a back surface of the processed film 3 and the principal surface 2a of the substrate 2 are bonded. The processed film 3 has a front surface 3a made of magnesium oxide having a (111) plane as its front surface. The thickness of the processed film 3 is, for example, 0.5 to 100 nm. In addition, the thickness of the processed film 3 may be a thickness not exceeding 50 nm. Alternatively, the thickness of the processed film 3 may be 5 to 20 nm, and may be 7 to 15 nm.

Figure 2:
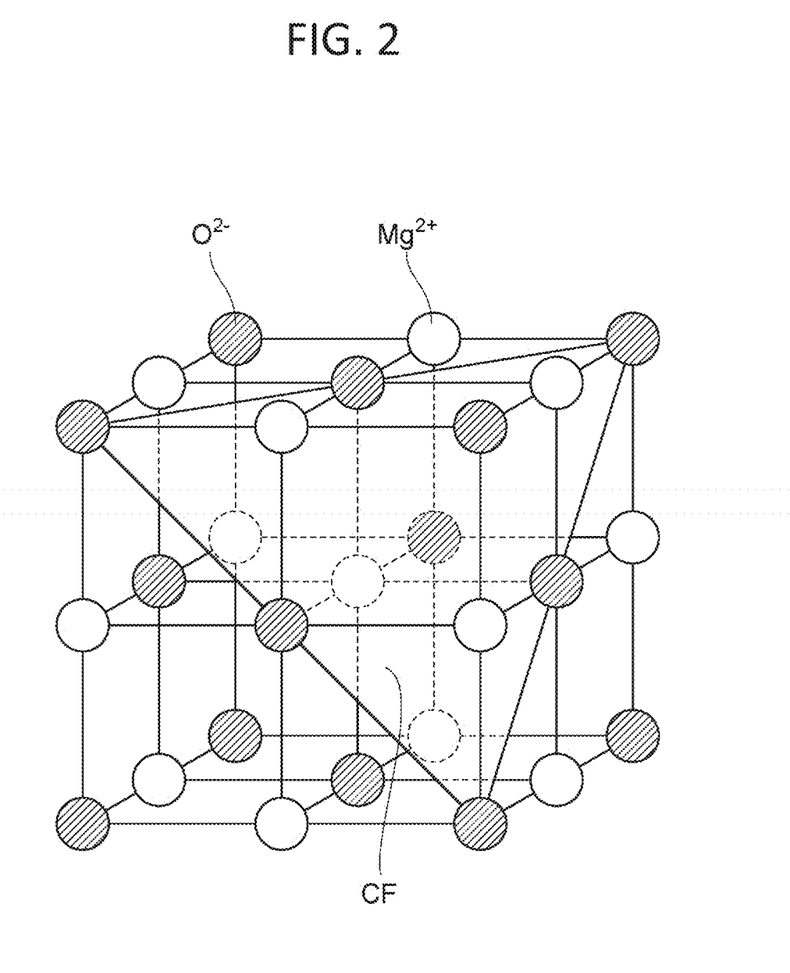
FIG. 2 is a view schematically showing a crystal structure of MgO.

Here, a general MgO crystal structure will be described. FIG. 2 is a view schematically showing the crystal structure of MgO. MgO has a sodium chloride type crystal structure which is a cubic crystal system, and the plane orientation of the front surface of MgO that naturally occurs is (100). The (100) plane of MgO that has been atomically flattened is a plane having $Mg^{2+}$ as cations and $O^{2-}$ as anions exposed in equal amounts, and is a stable plane because of being electrically neutral.

On the other hand, the processed film 3 according to the present embodiment has a front surface 3a consisting of a crystal face CF whose plane orientation is (111). On the crystal face CF, a plane with only $Mg^{2+}$ as cations exposed or a plane with only $O^{2-}$ as anions exposed is exposed. For this reason, the crystal face CF is charged to be electrically positive or negative, and is an electrostatically unstable plane. Such a crystal face CF has unique chemical and electrical surface characteristics. For example, the crystal face CF has strong basicity, electron donativity, or catalytic ability. A specific example of the catalytic ability is the ability to adsorb or reduce carbon dioxide ($CO_2$).

The front surface 3a of the processed film 3 has been atomically flattened. Being "atomically flat" is not limited to only where a crystal face is perfectly flat. When a crystal face flattened at the atomic level is actually prepared, the front surface of crystal is minutely inclined when observed at the atomic level. At this time, there is formed a step structure corresponding to an atomic layer on the front surface of crystal. Such a case is also included in the case where the crystal face is "atomically flat." Specifically, the root mean square roughness $R_q$ of the front surface 3a of the processed film 3 is in a range not exceeding, for example, 1.0 nm. Moreover, the root mean square roughness $R_q$ may be in a range not exceeding 0.5 nm. $R_q$ is calculated by using an atomic force microscope, for example, by scanning an area that is 1 to 2 μm on one side.

Next, description will be given of a manufacturing method for the processed plate 1. For manufacturing of the processed plate 1, for example, a laser abrasion method can be used. According to the laser abrasion method, the processed plate 1 can be manufactured under relatively wide film forming conditions.

Figure 3:
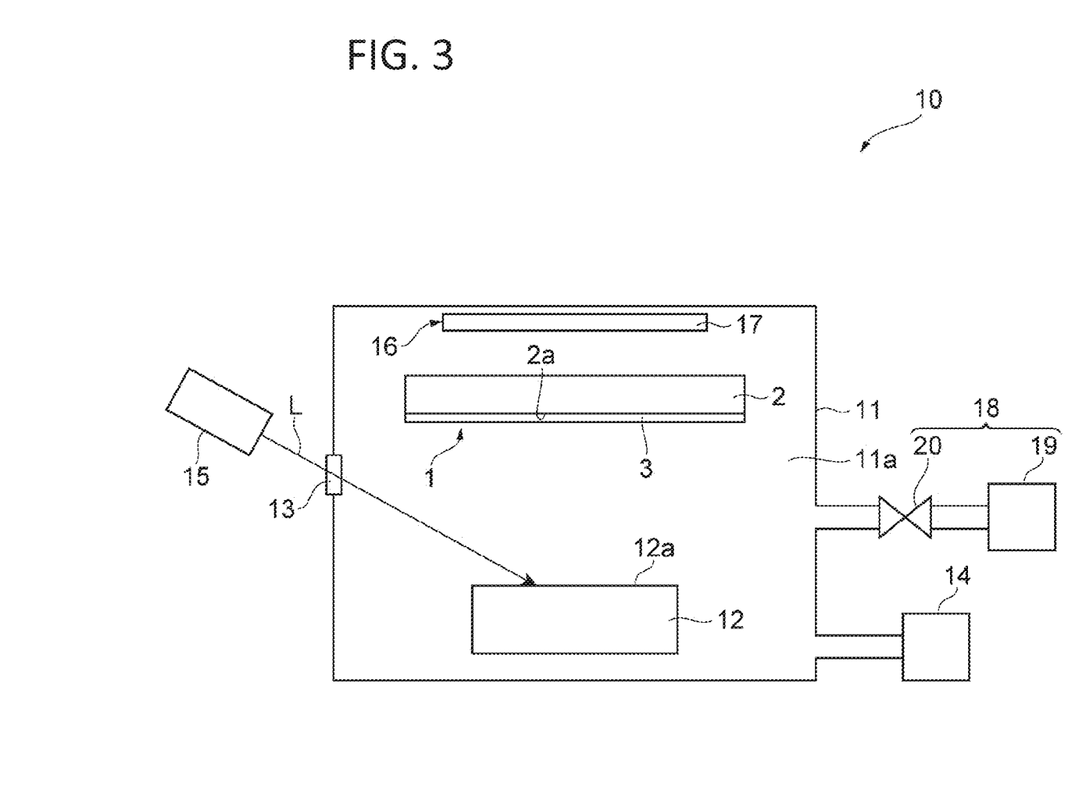
FIG. 3 is a view for explaining a main configuration of a manufacturing apparatus.

FIG. 3 is a view for explaining a configuration of a manufacturing apparatus 10. The manufacturing apparatus 10 includes a chamber 11, a substrate 2, and a target 12.

The chamber 11 demarcates inside thereof a processing space 11a that houses the substrate 2 and the target 12. The substrate 2 is disposed, for example, in an upper part of the processing space 11a. The target 12 is disposed in a lower part of the processing space 11a. That is, the target 12 is disposed in a direction vertically downward with respect to the substrate 2, separate from the substrate 2. The distance between the target 12 and the substrate 2 is arbitrary, and it suffices to appropriately select the distance according to the scale of the manufacturing apparatus 10. The target 12 is a raw material for the processed film 3 to be formed on the principal surface 2a of the substrate 2.

In a sidewall of the chamber 11, a window 13 arranged to be optically transparent is provided. A laser light source 15 is disposed outside the chamber 11, and generates laser light L to be irradiated on the target 12. The laser light source 15 emits the laser light L to the target 12 via the window 13.

To the chamber 11, an exhaust device 14 is connected. The exhaust device 14 decompresses the processing space 11a in the chamber 11. The exhaust device 14 is a predetermined vacuum pump. For example, a turbomolecular pump, an oil diffusion pump, or the like can be used. In this manner, the chamber 11 is arranged to be evacuable. Further, to the chamber 11, a gas introduction device 18 is connected. The gas introduction device 18 includes a gas source 19 and a valve 20, and introduces a predetermined gas into the processing space 11a of the chamber 11.

Moreover, in the processing space 11a, a heating device 16 is disposed. The heating device 16 includes a lamp light source 17. Light from the lamp light source 17 is converged to the substrate 2, and can heat the substrate to a predetermined temperature.

Subsequently, description will be given of a process for manufacturing the processed plate 1. First, the substrate 2 and the target 12 are disposed in the chamber 11. In addition, a case where $SrTiO_3$ or YSZ is used as an example of the material for the substrate 2 and its principal surface 2a is a (111) plane will be described. Also, a case where a MgO sintered body or a MgO single crystal is used as an example of the target 12 will be described.

After disposing the substrate 2 and the target 12 in the chamber 11, the interior of the chamber 11 is decompressed to an order of $10^{-5}$ to $10^{-7}$ Pa. Subsequently, oxygen gas is injected from the outside using the gas introduction device 18 to set the oxygen partial pressure to an order of, for example, $10^{-2}$ to $10^{-5}$ Pa. The oxygen partial pressure may be $0.5 \times 10^{-3}$ to $2.0 \times 10^{-3}$ Pa. Next, lamp light is converged to the substrate 2 from the lamp light source 17 to heat the substrate 2 to a predetermined temperature. The predetermined temperature is, for example, 400 to 700 C.°. The predetermined temperature may be 600 to 650 C.°.

Next, laser light L is irradiated into the chamber 11 through the window 13 of the chamber 11. The laser light L is a pulsed laser light, has a high energy density, and is irradiated to the target 12. For example, the laser light L is a KrF excimer laser (krypton fluoride excimer laser) light having a wavelength of 248 nm. The laser light L to be introduced into the chamber 11 has a total energy of 50 mJ or more. Moreover, the total energy of the laser light L may be 50 to 150 mJ. When the laser light L is irradiated to a front surface 12a of the target 12, MgO on the front surface 12a of the target 12 is stripped. The stripped MgO is deposited on the principal surface 2a of the substrate 2a, and is epitaxially grown. The processed film 3 is thereby formed.

As above, by directly depositing the processed film 3 on the (111) plane of $SrTiO_3$ or (111) plane of YSZ and epitaxially growing the same, a processed film 3 of the (111) plane is formed, and a processed plate 1 is manufactured. In the case of film formation by a laser abrasion method, energy during film formation is great as compared with that in the case of film formation by a molecular beam epitaxy method or the like. Energy that is great during film formation is considered to contribute to formation of a MgO(111) plane.

In addition, the above-described embodiment is an exemplification of a processed plate and preparation method according to the present invention. The processed plate and preparation method according to the present invention is not limited to the above-described embodiment. The processed plate and preparation method according to the above-described embodiment may be modified or applied to others within a range not changing the gist described in the claims.

For example, in the above-described embodiment, a description has been given of an example of the substrate 2 doped with an impurity, but the present invention is not limited thereto. As the substrate 2, $SrTiO_3$ or the like doped with no impurity may be used.

Moreover, in the above-described embodiment, a description has been given of an example of the method of heating the substrate 2 by light from the lamp light source 17 in the manufacturing process for the processed plate 1, but the present invention is not limited thereto. Various methods can be used for heating the substrate 2. For example, infrared laser light may be used in place of light from the lamp light source 17.

EXAMPLES

Hereinafter, examples and comparative examples carried out by the present inventor will be mentioned in order to describe the abovementioned effects.

Examples

Processed plates according to examples were prepared using the manufacturing apparatus 10 shown in FIG. 3. As the examples, processed films made of MgO having (111) planes as their front surfaces were formed on the principal surfaces of substrates. A specific configuration of the manufacturing apparatus 10 and preparation conditions are as follows.

Target: MgO single crystal target

Substrate: SrTiO$_3$ doped with Nb having a (111) plane at its front surface (The doping amount of Nb is 0.5 percent by weight.)

Laser light source: Excimer laser COMPexPro 201 manufactured by Coherent, Inc.

Laser wavelength: 248 nm

Amount of laser energy: 100 mJ

Laser pulse frequency: 10 Hz

Comparative Examples

Processed plates according to comparative examples were prepared using the manufacturing apparatus 10 shown in FIG. 3. A processed films made of MgO having (100) planes as their front surfaces were formed on the principal surfaces of substrates. A specific configuration of the manufacturing apparatus 10 and preparation conditions are the same as those of the examples except for the substrates.

Substrate: SrTiO$_3$ doped with Nb having a (100) plane at its front surface (The doping amount of Nb is 0.5 percent by weight.)

(Structural Evaluation)

Figure 4:
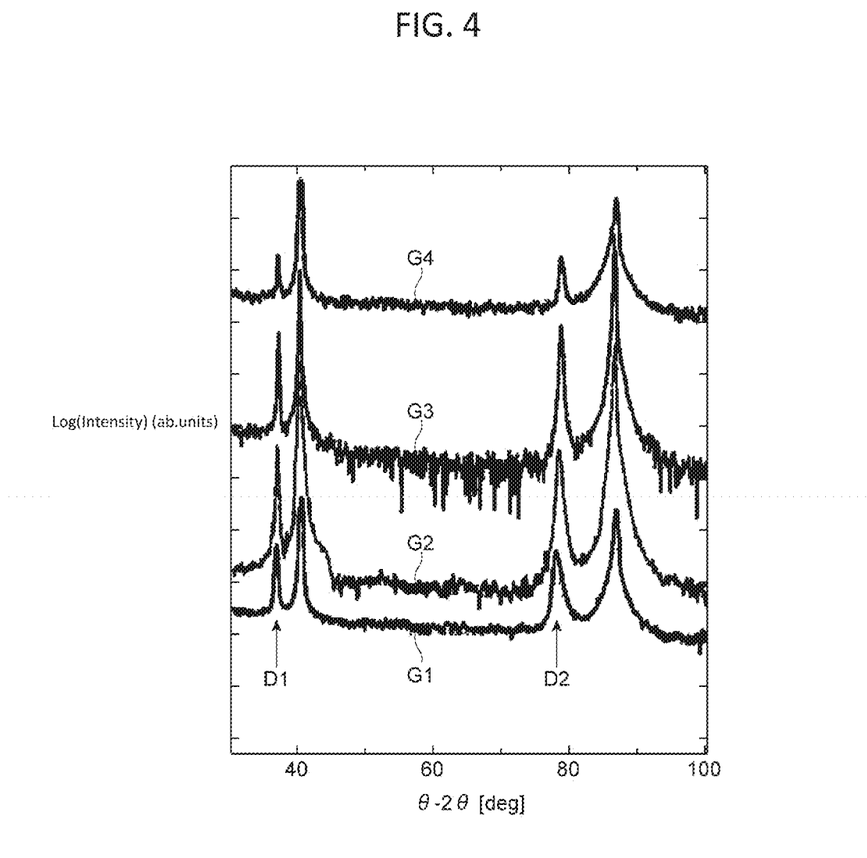
FIG. 4 shows XRD patterns of processed plates according to examples.

A structural evaluation of the processed films 3 according to the examples was performed. FIG. 4 shows X-ray diffraction patterns of processed plates according to the examples. In FIG. 4, graph G1 is a pattern of a processed plate formed when the temperature of the substrate was 400° C., graph G2 is a pattern of a processed plate formed when the temperature of the substrate was 500° C., graph G3 is a pattern of a processed plate formed when the temperature of the substrate was 600° C., and graph G4 is a pattern of a processed plate formed when the temperature of the substrate was 700° C. Moreover, processed films of these processed plates were formed in an environment where the oxygen partial pressure was $1 \times 10^{-3}$ Pa. As shown in graph G1 to graph G4, it has been confirmed that under any temperature condition, peaks appear at site D1 indicating a (111) plane of MgO and site D2 indicating a (222) plane. Thereby, it has been confirmed that a processed film made of MgO having a (111) plane as its front surface is formed in a range of the substrate temperature of 400 to 700° C. Moreover, it has been confirmed that a processed film made of MgO having a (111) plane as its front surface is formed when the amount of laser energy is 100 mJ. When it is considered that energy that is great during film formation contributes to formation of a MgO(111) plane, it can be said to have been suggested that MgO having a (111) plane as its front surface is formed at least with the amount of laser energy of 100 mJ or more.

(Front Surface Observation Results)

Figure 5A:
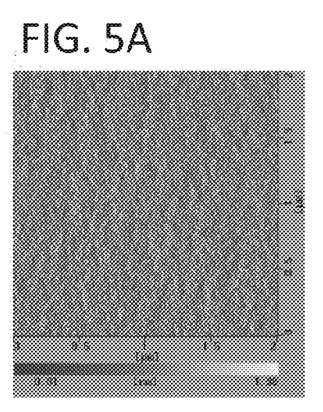
FIG. 5(a) is with a film thickness of 5 nm.
Figure 5B:
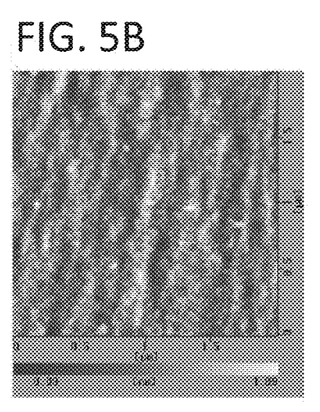
FIG. 5(b) is with a film thickness of 10 nm.
Figure 5C:
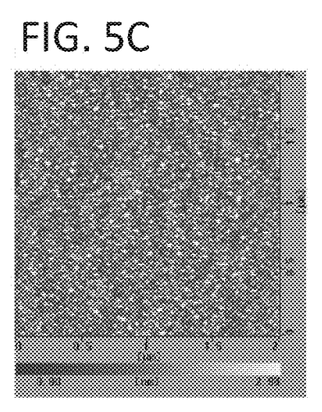
FIG. 5(c) is with a film thickness of 20 nm.
Figure 5D:
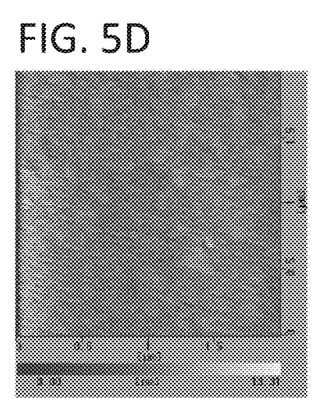
FIG. 5(d) is with a film thickness of 50 nm.

The front surface of processed films of the processed plates 1 according to the examples was observed using an atomic force microscope. Samples of the examples were prepared as observation objects at a substrate temperature of 600 to 650° C. and an oxygen partial pressure of $1.5 \times 10^{-3}$ Pa during processed film formation. As the atomic force microscope, SPI3800N Probe Station manufactured by SII NanoTechnology Inc. was used. As measurement conditions, 2 micrometers square of the sample front surfaces were observed in the atmosphere. The results are shown in FIG. 5. FIG. 5(a) is an AFM image of a processed film of a processed plate according to the example with a film thickness of 5 nm, FIG. 5(b) is an AFM image with a film thickness of 10 nm, FIG. 5(c) is an AFM image with a film thickness of 20 nm, and FIG. 5(d) is an AFM image with a film thickness of 50 nm. In FIG. 5(a), the blackest part expresses 0.81 nm, and the whitest part expresses 1.36 nm. In FIG. 5(b), the blackest part expresses 0.00 nm, and the whitest part expresses 1.89 nm. In FIG. 5(c), the blackest part expresses 0.00 nm, and the whitest part expresses 2.98 nm. In FIG. 5(d), the blackest part expresses 0.00 nm, and the whitest part expresses 13.31 nm. As shown in the AFM images shown in FIGS. 5(a) to (c), it could be confirmed that the front surfaces of MgO(111) having film thicknesses of 5 nm to 20 nm have grown as films with little unevenness. On the other hand, it could be confirmed that the front surface of MgO(111) having a film thickness of 50 nm has grown as a film with relatively much unevenness. Moreover, the root mean square roughness $R_q$ was measured with the measurement of AFM images. The root mean square roughness $R_q$ was 0.3037 nm with a film thickness of 5 nm, the root mean square roughness $R_q$ was 0.2992 nm with a film thickness of 10 nm, the root mean square roughness $R_q$ was 0.4702 nm with a film thickness of 20 nm, the root mean square roughness $R_q$ was 1.580 nm with a film thickness of 20 nm. As indicated by the measurement results of the root mean square roughness $R_q$, it has been confirmed that the processed films of the processed plates 1 according to the examples have a root mean square roughness $R_q$ of 0.5 nm or less in a range of the film thickness not exceeding 50 nm, and are flat surfaces. It has been specifically confirmed that, when the film thickness is 5 nm to 20 nm, the processed film has a root mean square roughness $R_q$ of 0.5 nm or less and is a flat surface.

(Surface Characteristics Evaluation)

Surface characteristics of the processed plate 1 according to the example and the processed plate according to the comparative example were evaluated. As an adsorbate of an adsorption experiment to evaluate chemical properties (acidity and basicity) of the front surface of the substrate, $CO_2$ or $NH_3$ has been most normally adopted. $CO_2$ was used here to evaluate adsorption characteristics and reduction characteristics. In this evaluation, adsorption characteristics of $CO_2$, that is, the basicity of the front surface was evaluated by measuring gas thermal desorption characteristics of $CO_2$. Moreover, reduction characteristics of $CO_2$, that is, the degree of chemical activity was evaluated by measuring gas thermal desorption characteristics of CO. The gas thermal desorption characteristics were measured using quadrupole mass spectrometry. The quadrupole mass spectrometry is a method of adding perturbation to ions by passing ions through four electrode tubes applied with a high-frequency voltage, passing only desired ions therethrough, and measuring the mass of the passed ions. In this evaluation, a processed plate including a processed film with a thickness of 50 nm prepared in a state where the substrate temperature was 650° C. was used as the example. On the other hand, a processed plate including a processed film with a thickness of 5 nm prepared in a state where the substrate temperature was 650° C. was used as the comparative example.

Figure 6A:
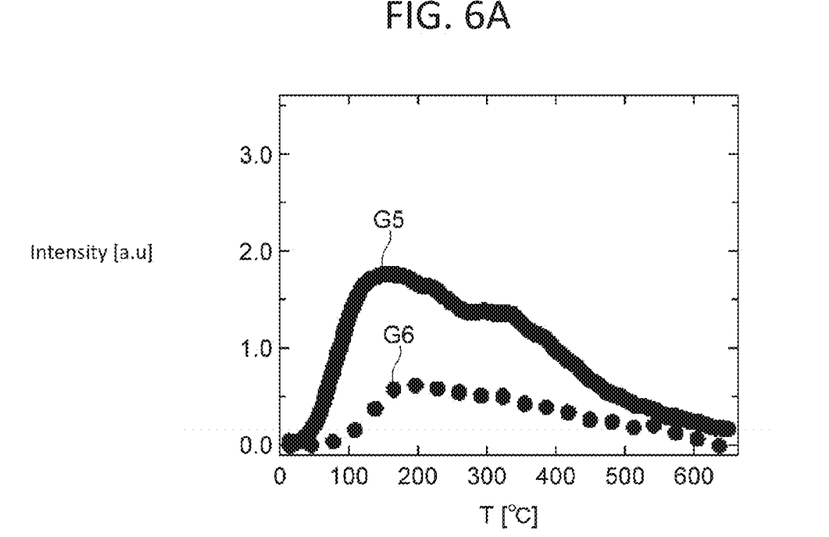
FIG. 6(a) is a diagram for explaining characteristics of processed films according to an example.

FIG. 6(a) shows gas thermal desorption characteristics of $CO_2$ and CO of the processed plate according to the example. In FIG. 6(a), graph G5 shows gas thermal desorption characteristics of $CO_2$, and graph G6 shows gas thermal desorption characteristics of CO. As shown in graph G5, it has been confirmed that desorption of $CO_2$ from the front surface 3a occurred from around 50° C. Moreover, as shown in graph G6, it has been confirmed that $CO_2$ on the front surface 3a is reduced to produce CO from around 50° C., and further, a large amount of CO was produced from around 100° C. Thus, it has been confirmed that, in the $CO_2$ reduction method using the processed film 3, a reduction of $CO_2$ proceeds on the front surface 3a without irradiation of ultraviolet rays or the like. That is, because a reduction of carbon dioxide occurred at a relatively low temperature of 50° C. to 100° C., it has been confirmed that the processed film of the processed plate according to the example has strong basicity.

Figure 6B:
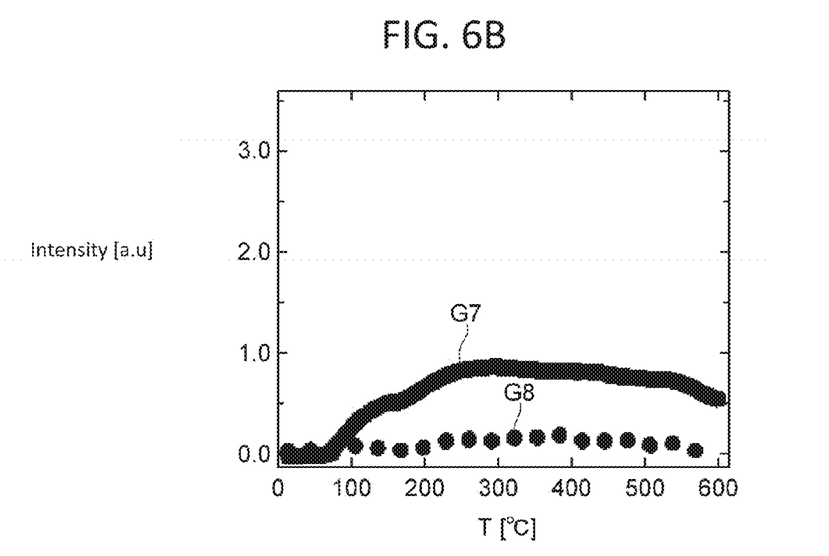
FIG. 6(b) is a diagram for explaining characteristics of processed films according to a comparative example.

FIG. 6(b) shows gas thermal desorption characteristics of $CO_2$ and CO of the processed plate according to the comparative example. In FIG. 6(b), graph G7 shows gas thermal desorption characteristics of $CO_2$, and graph G8 shows gas thermal desorption characteristics of CO. As shown in graph G7, it has been confirmed that desorption of $CO_2$ from the front surface occurred from around 50° C. On the other hand, as shown in graph G8, the production of CO is almost zero, and it has been confirmed that CO is not produced because $CO_2$ is not reduced even by heating the processed film.

Then, it has been confirmed by a comparison of graph G5 with graph G7 that the amount of $CO_2$ desorption from the processed film according to the example is larger than the amount of $CO_2$ desorption from the processed film according to the comparative example. Thus, it has been confirmed that the processed film having a front surface consisting of a (111) plane of MgO can efficiently adsorb $CO_2$ as compared with the processed film having a front surface consisting of a (100) plane of MgO. That is, it has been confirmed that the processed film of the processed plate according to the example is stronger in the basicity of the front surface than the processed film of the processed plate according to the comparative example.

INDUSTRIAL APPLICABILITY

Conventionally, as thin-film substrates, MgO substrates having naturally occurring (100) planes as their front surfaces have been used. On the other hand, the lattice constant of a (111) plane of MgO is different from the lattice constant of a currently commercially available substrate on the front surface of which a triangular lattice is formed. Thus, the processed plate 1 according to the present embodiment is useful as a new thin-film growth substrate for electronics.

Further, conventionally, a thin-film growth substrate has been selected by mainly focusing on the matching of lattice constants, not by focusing on the catalytic ability etc., on the front surface of the substrate. On the other hand, the processed plate 1 according to the present embodiment has strong basicity and chemical activity caused by polarization in the vertical direction to the front surface of the substrate. Therefore, it is possible to have added value as a substrate for crystal growth of a thin film or the like. For example, the processed plate 1 according to the present embodiment may be adopted as a substrate for thin-film growth by a soft solution process or as a substrate for CVD. Moreover, the electronic state of a thin film can also be modulated, after preparing a thin film on the processed plate 1 according to the present embodiment, by using polarization of the processed film of said processed plate 1. Moreover, a natural growth surface of the magnetite $Fe_3O_4$ described in Non-Patent Document 1 is not a (100) plane but a (111) plane or a (110) plane. It is therefore expected that forming $Fe_3O_4$ on the processed plate 1 according to the present embodiment allows preparation of an $Fe_3O_4$ film of higher quality. Moreover, because it is presumably considered that neither of the (111) planes of MgO described in Non-Patent Documents 2 and 3 is flat, it is supposed that using the flat MgO(111) of the processed plate 1 according to the present embodiment makes the functions and effects described in Non-Patent Documents 2 and 3 more remarkable. That is, the processed plate 1 according to the present embodiment is useful as a thin-film substrate for the ferromagnet having a spinel structure described in Non-Patent Document 2. Moreover, taking advantage of being a flat surface, it can be suitably adopted for a device for which the interface roughness needs to be suppressed, such as a magnetic tunnel junction element. Further, the processed plate 1 according to the present embodiment is also useful as a substrate of the ferroelectric thin film described in Non-Patent Document 3. Moreover, taking advantage of being a (111) film of MgO and being a flat surface, the film thickness of a dielectric thin film having desired characteristics can be reliably reduced. Further, the processed plate 1 can be used for, for example, a processing having a process of causing reaction of molecules while depositing on the substrate like MOCVD or the like.

Further, as a catalyst, a rare metal such as platinum or palladium or a hybrid of a rare metal and an oxide has been used. However, these substances are rare and are also toxic in some cases. On the other hand, the processed plate 1 according to the present embodiment uses MgO. MgO is a common substance and is nontoxic. Thus, there is no need for concern about environmental pollution with the processed plate 1 according to the present embodiment. Further, because MgO has no toxicity to living organisms, the processed plate 1 according to the present embodiment can be used for selective adsorption of acid molecules in living organisms. For example, the processed plate 1 according to the present embodiment can be applied as a so-called biosensor, which is a detection element for biomolecules (protein, viruses, amino acids). Specifically, biomolecules can be detected based on a change in electrical conductivity of the processed plate 1 before and after adsorption of biomolecules. Accordingly, usage as a diagnostic drug or a test drug is available.

Also, $CO_2$ has continuously increased due to the use of fossil fuels. Because the $CO_2$ is chemically extremely stable, it is not easy to alter $CO_2$ to another chemical species under conditions of the atmospheric pressure and room temperature. Therefore, a method for collecting and confining or effectively using $CO_2$ has been studied. By the processed plate 1 according to the present embodiment, $CO_2$ can be efficiently adsorbed. Thus, it becomes possible to easily store $CO_2$.

Further, by the processed plate 1 according to the present embodiment 1, it is possible to reduce $CO_2$ to CO by causing $CO_2$ to be adsorbed on the processed film and then heating the processed film. Thus, because $CO_2$ can be easily reduced, it becomes possible to realize a reaction process using $CO_2$ as a starting material. Thus, $CO_2$ can be effectively used.

Moreover, the processed film of the processed plate 1 according to the present embodiment is formed on a substrate. Therefore, handling of the processed plate can be made easy. Further, the processed film can be coupled with another member via the substrate. Furthermore, when the substrate is one doped with an impurity to have conductivity, it is possible to easily control the temperature of the processed film by controlling a voltage to be applied to the substrate. Temperature control of the processed film allows easily controlling adsorption or reduction (desorption) of $CO_2$ in the processed film. Moreover, in the case of, for example, a substrate with low light transmittance, such as a substrate in a blackish color, it is considered that the substrate temperature rises to an order of 50° C. when the substrate is irradiated with sunlight. According thereto, adsorption or reduction (desorption) of $CO_2$ is performed on the processed film without artificially injecting energy. Therefore, $CO_2$ exhaled by plants in the nighttime can be adsorbed and stored using the processed plate, and the $CO_2$ can be desorbed from the processed plate in the daytime to be used as a raw material for photosynthesis.

REFERENCE SIGNS LIST

1 . . . processed plate, 2 . . . substrate, 3 . . . processed film, 5 processing apparatus, 10 . . . manufacturing apparatus, 11, 21 . . . chamber, 12 . . . target, 13 . . . window, 14 . . . exhaust device, 15 . . . laser light source, 16, 25 . . . heating device, 17 . . . lamp light source, 18 . . . gas introduction device, G1 to G8 . . . graphs, L . . . laser light.

The invention claimed is:

1. A preparation method for a magnesium oxide thin film which is a method for depositing a magnesium oxide thin film on a substrate by a laser abrasion method using a sintered body or single crystal of magnesium oxide as a target, wherein
a flat processed film made of magnesium oxide having a (111) plane as its front surface is prepared, using a substrate made of strontium titanate having a (111) plane as its principal surface or yttria-stabilized zirconia having a (111) plane as its principal surface, by directly depositing a film on the principal surface of the substrate and epitaxially growing the film,
an amount of laser energy in the laser abrasion method is 50 mJ or more, and
the processed film is a film having a film thickness not exceeding 50 nm, and is a film having a root mean square roughness $R_q$ of a magnesium oxide (111) plane not exceeding 0.5 nm.

2. The preparation method for a magnesium oxide thin film according to claim 1, wherein the processed film is a film having a film thickness of 5 to 20 nm.

3. The preparation method for a magnesium oxide thin film according to claim 1, wherein a substrate temperature during film formation of the processed film is 600 to 650° C.

4. The preparation method for a magnesium oxide thin film according to claim 2, wherein a substrate temperature during film formation of the processed film is 600 to 650° C.

5. The preparation method for a magnesium oxide thin film according to claim 1, wherein an oxygen partial pressure during film formation of the processed film is $0.5 \times 10^{-3}$ to $2.0 \times 10^{-3}$ Pa.

6. The preparation method for a magnesium oxide thin film according to claim 2, wherein an oxygen partial pressure during film formation of the processed film is $0.5 \times 10^{-3}$ to $2.0 \times 10^{-3}$ Pa.

7. The preparation method for a magnesium oxide thin film according to claim 3, wherein an oxygen partial pressure during film formation of the processed film is $0.5 \times 10^{-3}$ to $2.0 \times 10^{-3}$ Pa.

8. The preparation method for a magnesium oxide thin film according to claim 4, wherein an oxygen partial pressure during film formation of the processed film is $0.5 \times 10^{-3}$ to $2.0 \times 10^{-3}$ Pa.

* * * * *